United States Patent
Xu et al.

(10) Patent No.: US 9,223,198 B2
(45) Date of Patent: Dec. 29, 2015

(54) MASK PLATE AND MANUFACTURING METHOD THEREOF

(71) Applicants: HEFEI BOE OPTOELECTRONICS TECHNOLOGY CO., LTD., Anhui (CN); BOE TECHNOLOGY GROUP CO., LTD., Beijing (CN)

(72) Inventors: Xiangyang Xu, Beijing (CN); Liyun Deng, Beijing (CN); Minsu Kim, Beijing (CN); Lei Du, Beijing (CN); Kai Wang, Beijing (CN); Min Zhang, Beijing (CN)

(73) Assignees: HEFEI BOE OPTOELECTRONICS TECHNOLOGY CO., LTD., Hefei, Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 140 days.

(21) Appl. No.: 14/068,795

(22) Filed: Oct. 31, 2013

(65) Prior Publication Data

US 2014/0120461 A1    May 1, 2014

(30) Foreign Application Priority Data

Nov. 1, 2012  (CN) .......................... 2012 1 0430683

(51) Int. Cl.
*G03F 1/38* (2012.01)
*G03F 1/56* (2012.01)

(52) U.S. Cl.
CPC .... *G03F 1/38* (2013.01); *G03F 1/56* (2013.01)

(58) Field of Classification Search
CPC ..................................... G03F 1/38; G03F 1/56
USPC ............................................................. 430/5
See application file for complete search history.

(56) References Cited

U.S. PATENT DOCUMENTS

| | | | |
|---|---|---|---|
| 5,414,746 A | 5/1995 | Deguchi et al. | |
| 5,700,606 A | 12/1997 | Kobayashi et al. | |
| 5,821,013 A * | 10/1998 | Miller et al. | 430/5 |
| 6,180,290 B1 * | 1/2001 | Hsu et al. | 430/5 |
| 8,883,372 B2 * | 11/2014 | Light et al. | 430/5 |
| 2008/0026299 A1 | 1/2008 | Chai et al. | |

(Continued)

FOREIGN PATENT DOCUMENTS

| CN | 101114119 A | 1/2008 |
|---|---|---|
| CN | 101963753 A | 2/2011 |

(Continued)

OTHER PUBLICATIONS

Second Chinese Office Action Issued May 23, 2014; Appln No. 201210430683.5.
First Chinese Office Action dated Oct. 8, 2013; Appln. No. 201210430683.5.

*Primary Examiner* — Stewart Fraser
(74) *Attorney, Agent, or Firm* — Ladas & Parry LLP

(57) ABSTRACT

Embodiments of the present invention disclose a mask plate and a manufacturing method thereof. The mask plate includes a mask plate body and a transmissive member, wherein the mask plate body has a transmissive part and a non-transmissive part adjacent to the transmissive part, the transmissive member is disposed corresponding to the transmissive part of the mask plate body, the absorbance of the transmissive member progressively increases in a direction away from a center region of the transmissive member to a edges region of the transmissive member close to the non-transmissive part.

13 Claims, 4 Drawing Sheets

(56) References Cited

U.S. PATENT DOCUMENTS

2009/0286379 A1* 11/2009 Hong .......................... 438/406
2010/0261098 A1* 10/2010 Hogue et al. ................. 430/5
2013/0098869 A1* 4/2013 Yu et al. ...................... 216/49

FOREIGN PATENT DOCUMENTS

JP          01-237660 A      9/1989
JP          2006-2561611 A   9/2006

* cited by examiner

MASK PLATE AND MANUFACTURING METHOD THEREOF

FIELD OF THE INVENTION

Embodiments of the present invention relate to mask plate and manufacturing method thereof.

BACKGROUND

In the field of display panel, with the development of high resolution display technologies, the number of pixels in unit area of a display panel is increasing, and the size of a pixel is decreasing. The linewidth of electrode wirings of pixel array in an array substrate and the black matrix in a color filter substrate is decreased accordingly, so as to maintain the opening ratio.

Light is an electromagnetic wave in nature. Due to the diffraction effect of electromagnetic wave itself, it is difficult to realize a process for narrow linewidth in traditional exposure and development processes.

In order to avoid the influence of light diffraction effect, there are provided the following existing types of mask plates to realize narrow linewidth fabrication:

Wing pattern mask design, as shown in FIG. 1, in which both sides of the non-transmissive part 01 in the mask plate are designed as sawtoothed protrusions 011 with an outer edge width b and a tooth root width c. After exposure and development, the width of resultant photoresist 012 on the substrate 04 is between b and c. This type of mask plate, due to its sawtoothed edges, can reduce diffraction of light passing through a transmissive part in the mask plate, at edges of residuary photoresist on the substrate 04, thus obtaining a better control of the width between both sides of the residuary photoresist on the substrate. Linewidth of a resultant structure such as a black matrix can be adjusted by changing the widths b and c of the mask plate. Using this type of mask plate, it is advantages to realize narrow linewidth by merely modifying the sawtooth design of the non-transmissive part in the mask plate. However, the structure obtained by this mask plate has lots of burrs on its two lateral surfaces, thus making the lateral surfaces non-smooth.

SSM (slit shot mask) design, as shown in FIG. 2, in which exposure range is adjusted by decreasing width of a non-transmissive part 02 in the mask plate, so as to obtain a photoresist with narrow linewidth. This method exactly utilizes the diffraction of light. However, it is difficult to control linewidth of the residual photoresist 021 on the substrate 04 after exposure and development. Thus, it is difficult to control linewidth of the resultant structure.

GTM mask design, as shown in FIG. 3, in which the mask plate has a non-transmissive part with different light transmittance in different non-transmissive section is used to realize narrow linewidth. For example, light transmittance of the middle region 032 in the non-transmissive part is smaller than that of the edge part 031. In the non-transmissive part shown in FIG. 3, light transmittance of corresponding sections is shown by the line 034. Although residual photoresist 033 with narrow linewidth can be obtained by this type of mask plate, it is difficult to control diffraction of light at edge of the non-transmissive part, and thereby it is difficult to control linewidth of the resultant structure.

SUMMARY

An embodiment of the present invention provides a mask plate comprising a mask plate body and a transmissive member, wherein the mask plate body has a transmissive part and a non-transmissive part adjacent to the transmissive part, the transmissive member is disposed corresponding to the transmissive part of the mask plate body, the absorbance of the transmissive member progressively increases in a direction away from a center region of the transmissive member to a edges region of the transmissive member close to the non-transmissive part.

In an example, the transmissive member is formed of photoresist.

In an example, the transmissive member has a width greater than or equal to that of the transmissive part of the mask plate body.

In an example, the transmissive member has a thin center and thick edges.

In an example, light-blockage particles are dispersed in the transmissive member, and in the transmissive member, the edge regions has a concentration of the light-blockage particles higher than that of the centre region.

In an example, two non-transmissive parts are located at opposite sides of the transmissive part, and an arc-like concave is formed in the centre region of the transmissive member such that the thickness of the transmissive member progressively increases from the center region to the side regions.

In an example, the photoresist is a positive photoresist or a photoresist negative.

In an example, the transmissive member is located on one side of the mask plate body.

In an example, the transmissive member is located in a transmissive slot of the transmissive part.

Another embodiment of the present invention provides a method for manufacturing a mask plate, comprising: coating a photoresist layer on the mask plate body; and exposing and developing the photoresist layer to form a transmissive member corresponding to the transmissive part of the mask plate body, the absorbance of the transmissive member progressively increasing in a direction from a centre region of the transmissive member toward edges region of the transmissive member close to the non-transmissive part.

In an example, the photoresist is a positive photoresist.

In an example, the step of exposing and developing the photoresist layer to form a transmissive member corresponding to the transmissive part of the mask plate body comprises: performing a first exposure and development process by covering the transmissive part, so as to form a residual photoresist corresponding to the transmissive part, the residual photoresist having a thick center and thin edges; and performing a second exposure and development process by covering at least the interface between the transmissive part and the non-transmissive part of the mask plate body, so as to form a residual photoresist corresponding to the transmissive part, so as to form the transmissive member having a thin center and thick edges.

BRIEF DESCRIPTION OF THE DRAWINGS

In order to clearly illustrate the technical solutions of embodiments of the present invention, in the following, the accompanying drawings of the embodiments will be described briefly; it is obvious that the following description of the drawings only relates to some embodiments of the invention and thus not limitative of the invention.

DETAILED DESCRIPTION OF THE PREFERRED EMBODIMENTS

In the following, with reference to the accompanying drawings related to embodiments of the present invention, the technical solutions of the embodiments will be described in a clear and fully understandable way; it is obvious that the described embodiments are just one part but not all of the embodiments of the invention. Other embodiment(s) obtained by those skilled in the art, based on embodiments of the present invention, without any inventive work, all belong to the protection scope of the present invention.

An embodiment of the present invention provide a mask plate that can get a better control of diffraction, of light passing through a transitive part thereof, at the edge of a non-transmissive part, thus resulting in a more accurate control of linewidth of the resultant structure.

Figure 1:
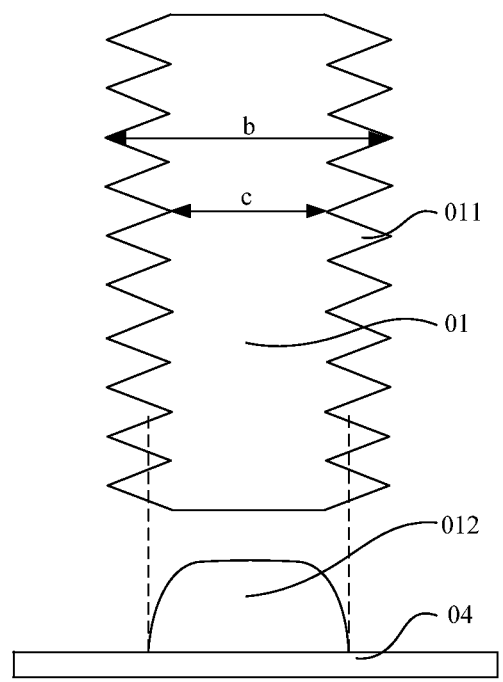
FIG. 1 is a schematic diagram showing exposure principle by using a mask plate of Wing pattern mask design in prior art.
Figure 2:
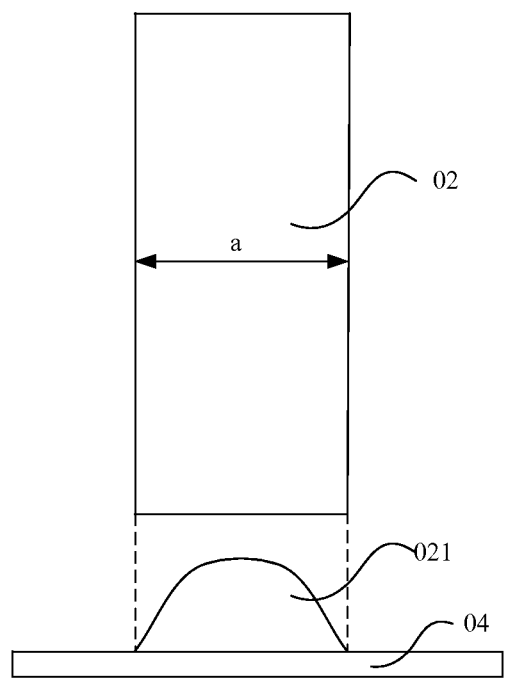
FIG. 2 is a schematic diagram showing exposure principle by using a mask plate of SSM (slit shot mask) design in prior art.
Figure 3:
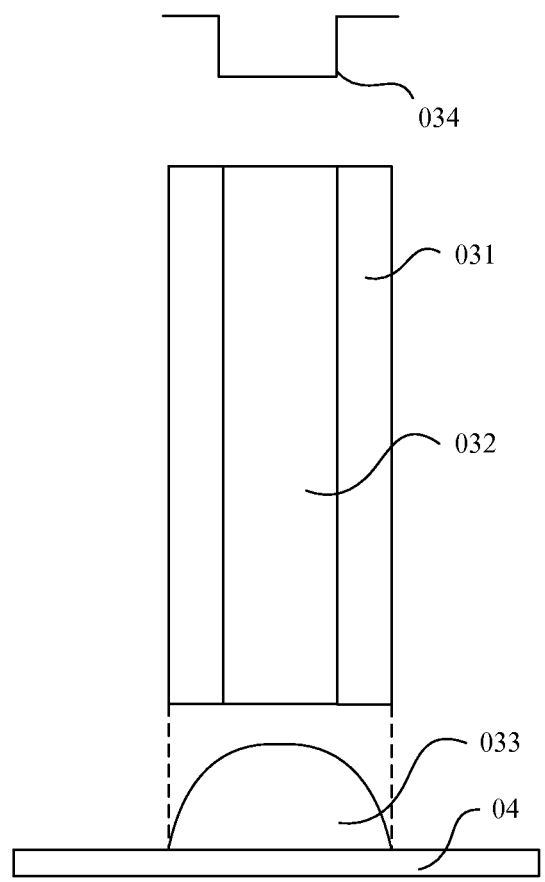
FIG. 3 is a schematic diagram showing exposure principle by using a mask plate of GTM mask design in prior art.
Figure 4:
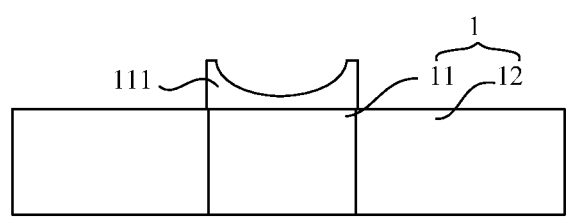
FIG. 4 is a structural schematic diagram showing a mask plate provided by an embodiment of the present invention.

As shown in FIG. 4, the mask plate provided by an embodiments of the present invention includes a mask plate body 1 having transmissive part 11 and non-transmissive part 12 adjacent to the transmissive part 11. In FIG. 4, the two non-transmissive parts 12 are located at opposite sides of the transmissive part 11. Above the transmissive part 11 is disposed a transmissive member 111 made of photoresist. The absorbance of the transmissive member 111 progressively increases in directions away from the midline of the transmissive member 111 towards the non-transmissive parts on both sides of the transmissive member 111.

As shown in FIG. 4, the transmissive parts 11 have a width of D. The transmissive member 111 can have a width greater than or equal to D. In this embodiment, the transmissive member 111 has a width D substantially identical with that of the transmissive part 11.

Figure 5:
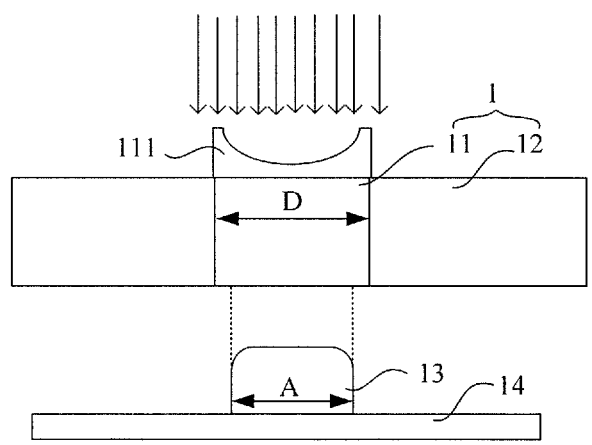
FIG. 5 is a schematic diagram showing the exposure principle by using the mask plate shown in FIG. 4.

Referring to FIG. 5, in the above-mentioned mask plate, since the absorbance of the transmissive member 111 progressively increases from its midline 111 towards the edges region, less light passes through the edges region of the transmissive member 111 adjacent to the interface of the transmissive part 11 and the non-transmissive parts 12, and less light is diffracted towards the non-transmissive parts 12 when passing through the transmissive part 11. On the other hand, although the absorbance of the transmissive member 111 is higher in its midline region and lower at its two side regions, light passing through the midline region of the transmissive part 11 is diffracted toward the two sides regions of the transmissive part 11. Thus, light passing through the entire transmissive part 11 and incident on photoresist located on the surface of the substrate 14 has a relatively uniform intensity distribution. In this case, referring to FIG. 5, the width A of the residual photoresist 13 on the substrate can be well controlled during exposure and development processes, and the residual photoresist 13 has a uniform width. Further, the resultant structure formed by using the residual photoresist 13 has a uniform and narrow linewidth, with fewer burrs on its lateral surfaces.

Therefore, the mask plate provided by the embodiment of the present invention can effectively control the diffraction of light at the interface between the transmissive part and the non-transmissive part thereof, thus capable of accurately controlling the linewidth of the resultant structure formed by using the mask plate.

During the exposure and development process by using the mask plate provided by the embodiment of the present invention, the substrate 14 can be coated with negative photoresist so as to obtain the residual photoresist 13 as shown in FIG. 5.

Alternatively, during the exposure and development process using the mask plate provided by the embodiment of the present invention, the substrate 14 can be coated with positive photoresist. In this case, the width of resultant photoresist can also be well controlled, and structures with narrow linewidth can be finally realized. The operation processes related is not described in detail herein.

In the above embodiments, the transmissive member can be implemented in many forms.

In an example, the transmissive member is a plate like structure with uniform thickness (not shown), wherein the concentration of light-blockage particles dispersed in the transmissive member increases in a direction away from its centre region towards edge regions adjacent to the non-transmissive part.

In an example, as shown in FIG. 4, an arc-like concave is formed in the upper surface of the transmissive member 111 provided above the transmissive part 11 of the above-mentioned mask plate. Therefore, the thickness of the transmissive member 111 increases in a direction away from its centre line region towards edge region adjacent to the non-transmissive part 12. In this case, all parts of the transmissive member 111 can be made of the same photoresist material, and the transmittance of the respective parts of the transmissive member 111 can be adjusted by merely controlling the radian of the arc-like concave.

For example, the photoresist used for transmissive member 111 can be a positive photoresist or a negative photoresist. The positive photoresist can be used to facilitate the fabrication of the transmissive member 111.

Furthermore, in the above embodiments, the transmissive member 111 can be provided in many positions with regard to the transmissive part 11.

For example, the transmissive member 111 can be provided on one side of the mask plate body 1, and the centre of the transmissive member 111 is aligned with that of the transmissive part 11, as shown in FIG. 4.

For example, the transmissive member 111 can also be provided in a transmissive slot (not shown in the figure) of the transmissive part 11.

Figure 6:
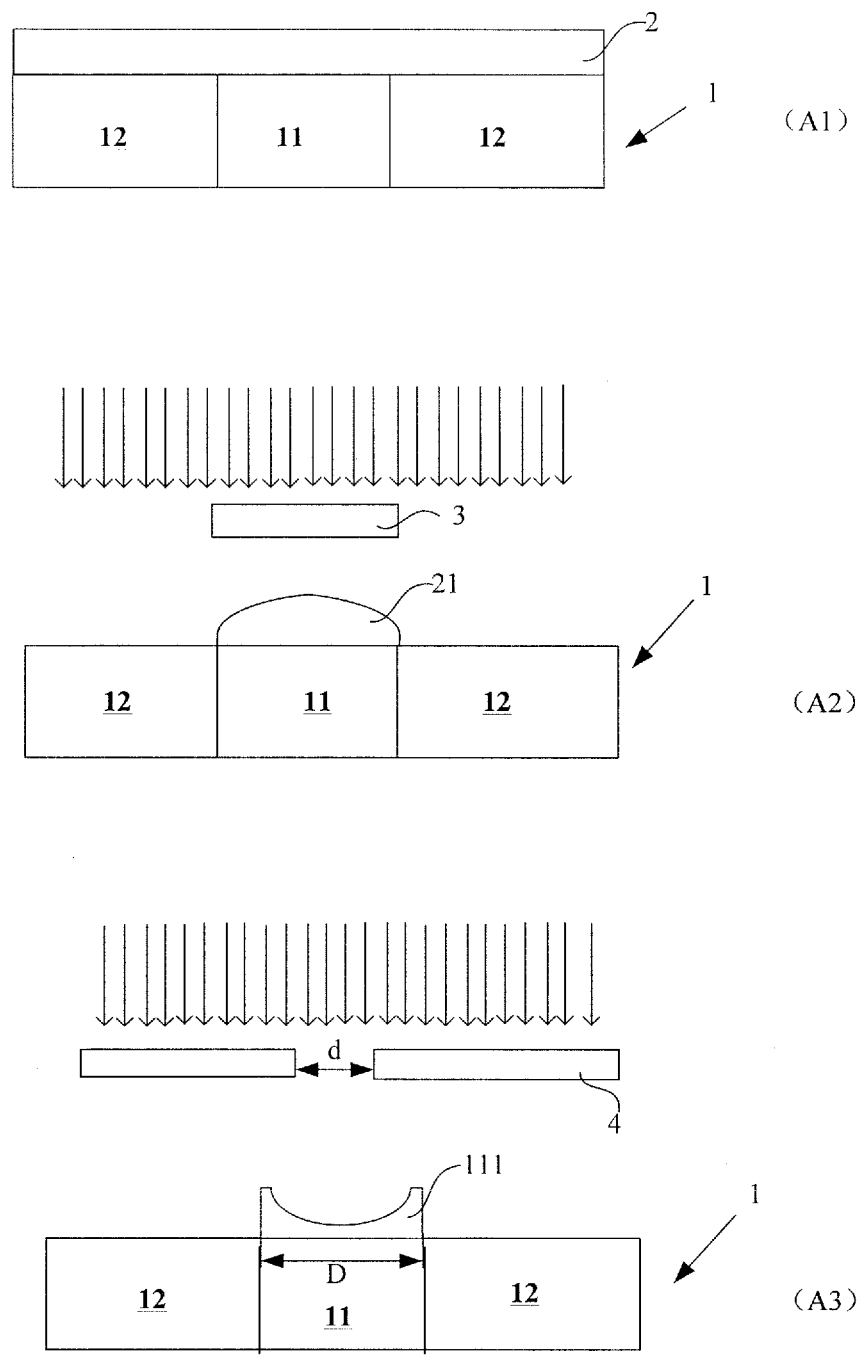
FIG. 6 is a schematic diagram showing the mask plate at different stage of a manufacturing method provided by an embodiment of the present invention.

An embodiment of the present invention further provides a method for manufacturing any one of the mask plates according to the above-mentioned embodiments. The method includes the following steps:

Step S601: coating the mask plate body 1 with a photoresist layer 2, as shown in state A1 of FIG. 6, wherein the mask plate body 1 can have a transmissive part 11 and two non-transmissive parts 12 adjacent to the transmissive part 11;

Step S602: exposing and developing the photoresist layer 2 so as to form a transmissive member 111 on the transmissive part 11 of the mask plate body 1.

For example, the photoresist used for the above-mentioned transmissive member 111 is a positive photoresist.

When the photoresist used for the above-mentioned transmissive member 111 is a positive photoresist, Step 602 of exposing and developing the photoresist layer so as to form a transmissive member 111 on the transmissive part 11 of the mask plate body 1 can include, for example, the following steps:

Step S701: performing a first exposure and development process by using a light shielding plate 3 covering the transmissive part 11 of the mask plate body 1 so as to form a residual photoresist 21 having a thick center and thin edges, as shown in state A2 of FIG. 6, wherein the width D of the residual photoresist 21 is, for example, identical with that of the transmissive part 11. In another example, the width D of the residual photoresist 21 is greater than that of the transmissive part 11.

Step S702: performing a second exposure and development process by using a light shielding plate 4 at least covering the interfaces between the transmissive part 11 and the non-transmissive parts 12 of the mask plate body 1 so as to form the transmissive member 111 having a thin center and thick edges, as shown in state A3 of FIG. 6.

The light blocking body 4 has for example an opening having a width d that is smaller than the width D of the transmissive part 11. During the second exposure and development process, the opening in the light shielding plate 4 is disposed corresponding to the transmissive part 11 of the mask plate body 1, as shown in state A3 of FIG. 6.

It should be noted that the mask plate body 1 itself can have some patterns. Therefore, the transmissive member 111 made of photoresist and corresponding to the transmissive part 11 of the mask plate body 1 can be formed on a surface of the mask plate body 1 or in a transmissive slot of the mask plate body 1. As to the mask plate body 1, an existing mask plate, such as the Wing pattern mask plate mentioned in the background, can be adopted.

In the above-mentioned embodiments of the present invention, since the absorbance of the transmissive member disposed corresponding to the transmissive part of the mask plate body progressively increases in a direction away from the centre region of the transmissive member towards the edge regions of the transmissive member adjacent to the non-transmissive part, less light passes through a corresponding edge region of the transmissive part adjacent to the interface of the transmissive part and the non-transmissive parts, and thus less light is diffracted towards the non-transmissive parts when passing through the transmissive part. On the other hand, although the absorbance of the transmissive member is higher in its centre region and lower at its edge regions, light passes through the centre region of the transmissive part is diffracted toward the edge regions of the transmissive part. Thus, light passing through the entire transmissive part and incident on a photoresist layer located on a surface of a substrate has a relatively uniform intensity distribution. In this case, the width of the residual photoresist on the substrate can be well controlled during exposure and development processes, and the lateral surfaces of the residual photoresist are formed to be smooth. Furthermore, the resultant structure formed by using the residual photoresist has a narrow and uniform linewidth, with fewer burrs on its lateral surfaces.

Therefore, in the mask plate provided by the embodiments of the present invention the diffraction at the interface between the transmissive part and the non-transmissive part of the mask plate body can effectively controlled, thereby improving the control accuracy of the linewidth of the resultant structure.

Although the present invention has been described in considerable detail with reference to particular embodiments thereof, some modifications or improvements can also be made on the basis of the present invention, which is evident to those skilled in the art. Therefore, the modifications or improvements, which are made without departing from the spirit of the present invention, all belong to the protection scope of the present invention.

What is claimed is:

1. A mask plate comprising a mask plate body and a transmissive member, wherein the mask plate body has a transmissive part and a non-transmissive part adjacent to the transmissive part, the transmissive member is disposed corresponding to the transmissive part of the mask plate body, the absorbance of the transmissive member progressively increases in a direction away from a center region of the transmissive member to an edge region of the transmissive member which is closer to the non-transmissive part with regard to the center region of the transmissive member.

2. The mask plate according to claim 1, wherein the transmissive member is formed of photoresist.

3. The mask plate according to claim 2, wherein the photoresist is a positive photoresist or a negative photoresist.

4. The mask plate according to claim 1, wherein the transmissive member has a width greater than or equal to that of the transmissive part of the mask plate body.

5. The mask plate according to claim 1, wherein the edge region of the transmissive member is thicker than the center region of the transmissive member.

6. The mask plate according to claim 1, wherein light-blockage particles are dispersed in the transmissive member, and in the transmissive member, the edge region has a concentration of the light-blockage particles higher than that of the center region.

7. The mask plate according to claim 1, wherein two non-transmissive parts are located at opposite sides of the transmissive part, and an arc-like concave is formed in the center region of the transmissive member such that the thickness of the transmissive member progressively increases from the center region to the edge region.

8. The mask plate according to claim 1, wherein the transmissive member is located on one side of the mask plate body.

9. The mask plate according to claim 1, wherein the transmissive member is located in a transmissive slot of the transmissive part.

10. The mask plate according to claim 1, wherein the transmissive member covers the transmissive part of the mask plate body.

11. A method for manufacturing a mask plate, comprising:
coating a photoresist layer on a mask plate body having a transmissive part and a non-transmissive part adjacent to the transmissive part; and
exposing and developing the photoresist layer to form a transmissive member corresponding to the transmissive part of the mask plate body, the absorbance of the transmissive member progressively increasing in a direction away from a center region of the transmissive member toward an edge region of the transmissive member which is closer to the non-transmissive part with regard to the center region of the transmissive member.

12. The method according to claim 11, wherein the photoresist is a positive photoresist.

13. The method according to claim 12, wherein the step of exposing and developing the photoresist layer to form a transmissive member corresponding to the transmissive part of the mask plate body comprises:
performing a first exposure and development process by covering the transmissive part, so as to form a residual photoresist corresponding to the transmissive part, the residual photoresist having a center region and an edge region, the edge region of the residual photoresist being thinner than the center region of the residual photoresist; and performing a second exposure and development process by covering at least the interface between the transmissive part and the non-transmissive part of the mask plate body, so as to form the transmissive member having a center region and an edge region, the edge region of the transmissive member being thicker than the center region of the transmissive member.

\* \* \* \* \*